(12) United States Patent
Surico et al.

(10) Patent No.: US 7,525,856 B2
(45) Date of Patent: Apr. 28, 2009

(54) APPARATUS AND METHOD TO MANAGE EXTERNAL VOLTAGE FOR SEMICONDUCTOR MEMORY TESTING WITH SERIAL INTERFACE

(75) Inventors: Stefano Surico, Milan (IT); Marco Passerini, Lozza (IT); Massimiliano Frulio, Milan (IT); Alex Pojer, Milan (IT)

(73) Assignee: Atmel Corporation, San Jose, CA (US)

( * ) Notice: Subject to any disclaimer, the term of this patent is extended or adjusted under 35 U.S.C. 154(b) by 193 days.

(21) Appl. No.: 11/696,521

(22) Filed: Apr. 4, 2007

(65) Prior Publication Data

US 2008/0246504 A1    Oct. 9, 2008

(51) Int. Cl.
G11C 29/00 (2006.01)
(52) U.S. Cl. .................... 365/201; 365/185.33
(58) Field of Classification Search ................. 365/201, 365/185.33, 185.23
See application file for complete search history.

(56) References Cited

U.S. PATENT DOCUMENTS

| | | | |
|---|---|---|---|
| 5,146,161 A | 9/1992 | Kiser | |
| 5,381,045 A | 1/1995 | Kojima | |
| 5,654,971 A | 8/1997 | Heitele et al. | |
| 6,259,627 B1 * | 7/2001 | Wong | 365/185.21 |
| 6,694,464 B1 | 2/2004 | Quayle et al. | |
| 7,190,622 B2 * | 3/2007 | Roohparvar | 365/185.22 |
| 7,369,437 B2 * | 5/2008 | Kamei | 365/185.17 |
| 7,457,178 B2 * | 11/2008 | Tu et al. | 365/201 |
| 2005/0285614 A1 | 12/2005 | Ma | |
| 2006/0184847 A1 | 8/2006 | Song et al. | |

* cited by examiner

Primary Examiner—Anh Phung
(74) Attorney, Agent, or Firm—Schwegman, Lundberg & Woessner, P.A.

(57) ABSTRACT

A serial-interface flash memory device includes a data/address I/O pin and a clock input pin. A bidirectional buffer is coupled to the data/address I/O pin. A serial interface logic block including data direction control is coupled to the clock pin, the bidirectional buffer, to internal control logic, and to read-voltage and modify-voltage generators. A first switch is coupled to the read-voltage generator and the clock buffer and a second switch is coupled to the modify-voltage generator and the clock buffer, the first and second switches each having a control input. Memory drivers are coupled to the read-voltage generator and the modify-voltage generator through the first and second switches. First and second registers coupled between the serial interface logic and the first and second switches. A memory array is coupled to the memory drivers and read amplifiers and program buffers are coupled between the serial interface logic and the memory drivers.

7 Claims, 10 Drawing Sheets

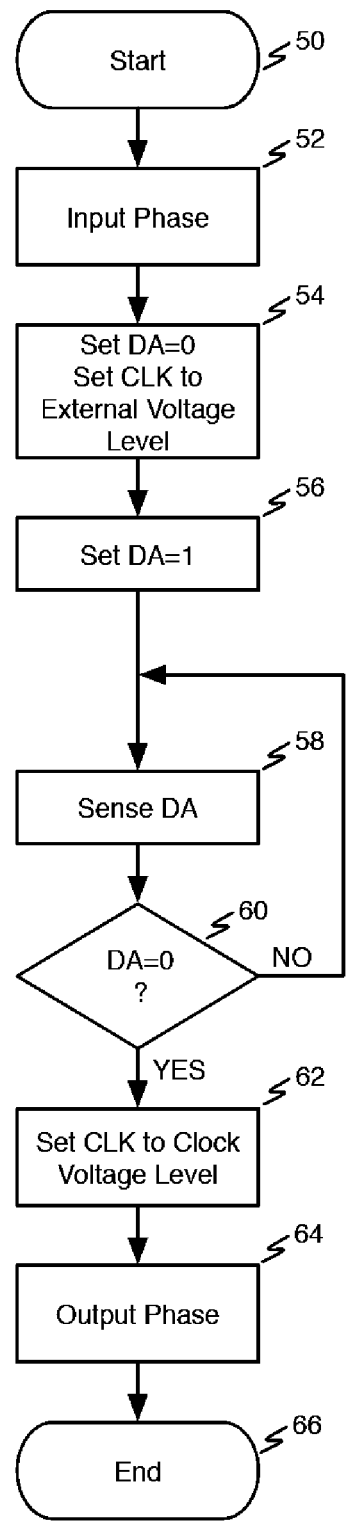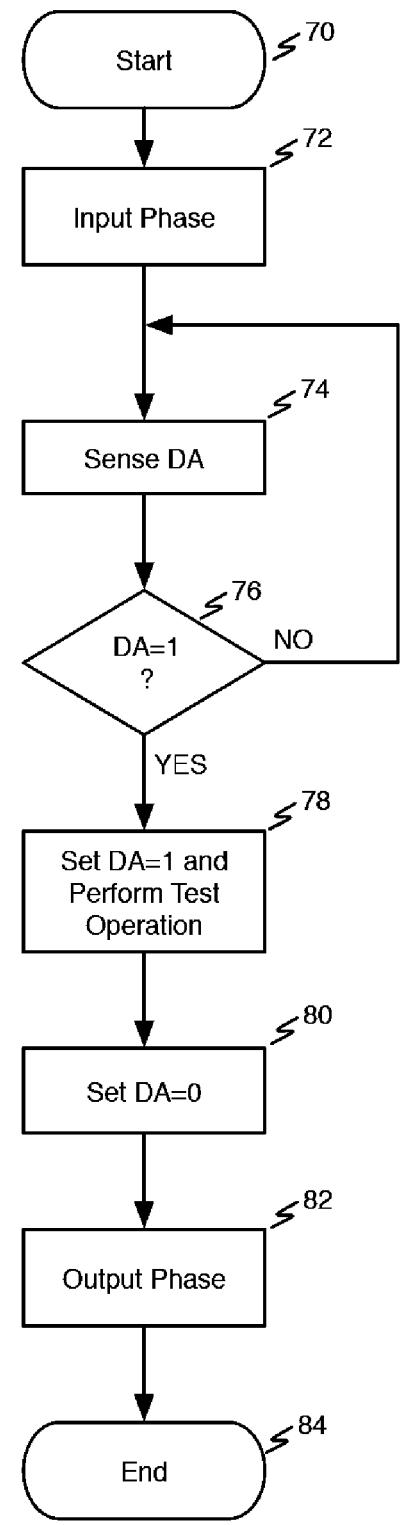
FIGURE 9A
FIGURE 9B

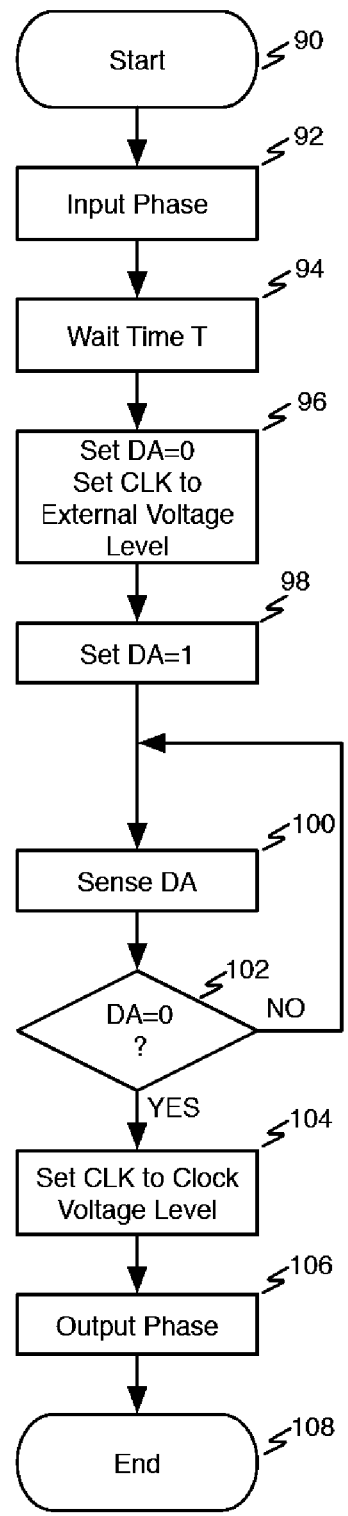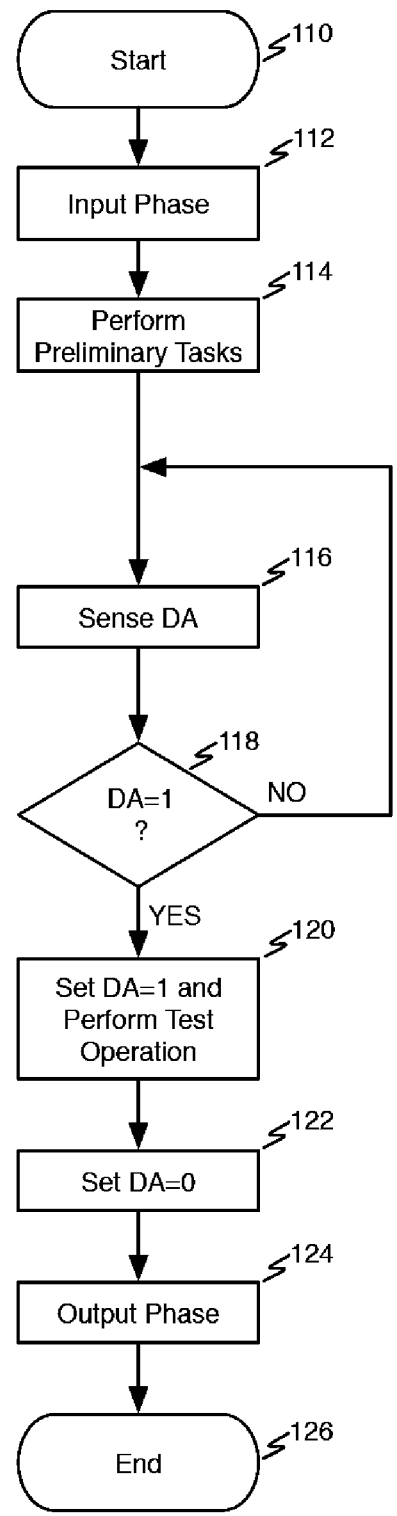
FIGURE 12A
FIGURE 12B

APPARATUS AND METHOD TO MANAGE EXTERNAL VOLTAGE FOR SEMICONDUCTOR MEMORY TESTING WITH SERIAL INTERFACE

BACKGROUND OF THE INVENTION

1. Field of the Invention

The present invention relates to semiconductor memories. More particularly, the present invention relates to testing semiconductor memories having serial interfaces particularly, but not limited to, EPROM, EEPROM, and flash memories.

2. The Prior Art

Because of their superior characteristics with respect other storage devices, semiconductor memories have become ubiquitous in many modern electronic appliances and systems. Moreover, the push for high integration has led to a dramatic increase of storage capability in a reduced silicon area, hence decreasing memory costs.

Among these devices, flash memories are electrical programmable and erasable non-volatile memories, and are thus particularly suitable for portable data storage applications such as mobile phones, digital still cameras, mp3 players and others.

Semiconductor memory testing is one of the most important phases of manufacturing and is a key factor for device profitability. Various tests are needed to verify a memory device. Examples include testing of embedded reference voltage or current generators, testing of internal control logic, testing of the matrix cells operations such as read, program or erase, and others.

To minimize fabrication costs and to decrease the product time-to-market, different tests are performed at different times and different levels while manufacturing a semiconductor memory. A major distinction can be made between off-line tests, i.e. tests that are performed at an early stage of the device production to solve problems with major impacts on yield, and in-line tests or production tests that are performed when the device is in line for high-volume production. The latter tests impact directly on device cost because they are proportional to the number of devices fabricated, therefore the test time per unit must be minimized.

The use of external voltages for memory testing is common in parallel interface devices. For example, in flash memories the external voltage level can be generated by a variable voltage generator and can be used to measure the cell-voltage threshold distribution, to program or erase a memory cell or group of cells, and for other tests.

Parallel interface memories have one or more dedicated pins that can be used during testing to supply the external voltage level to the memory circuits. FIG. 1 is a block diagram that shows an example of a parallel interface flash memory having data pins (I/O), address pins (ADD), a clock pin (CLK), and one dedicated pin (EXT) for supplying external voltages.

The external voltage pin is not provided in serial interface memories. Excluding power supply connections, such memories have only two pins, a clock pin (CLK) and the data/address pin (DA). A typical memory with such a serial interface is represented as a block diagram in FIG. 2.

To decrease the testing time per unit, it is known that many parallel interface memories can be tested simultaneously by coupling them to a memory tester as shown in the block diagram of FIG. 3. To accomplish simultaneous test on parallel devices a reduction on the number of pins driven by the test equipment is often necessary. A minimum of two pins might be provided as in serial interface devices. In such a case, the EXT pin cannot be used as shown in FIG. 3. Simultaneous testing of serial interface memory devices is also performed as shown in FIG. 4.

FIG. 5 is a block diagram of a prior-art flash memory device having a serial interface. The DA pin sends and collects data to and from DA bidirectional buffer. The direction of the DA buffer (input or output) is controlled by a serial interface logic block by means of signal DA_OUT, i.e. DA_OUT=0 enables the DA buffer as an input buffer to receive data input at the DA pin, and DA_OUT=1 enables the DA buffer as an output buffer to place output data on the DA pin. The CLK pin is an input pin and the CLK buffer is a single-direction input buffer. Serial interface logic is connected to the internal logic or microcontroller via handshake protocol or handshake logic as is known in the art. The internal logic or internal microcontroller drives a read-voltage generator and a modify-voltage generator to supply, respectively, read voltage levels and program or erase voltage levels to the memory matrix array via memory drivers depending on the operation to be performed. Read amplifiers and program buffers are connected between the serial interface logic and the memory drivers.

BRIEF DESCRIPTION OF THE INVENTION

A serial-interface flash memory device includes a data/address I/O pin and a clock input pin. A bidirectional buffer is coupled to the data/address I/O pin. A serial interface logic block including data direction control is coupled to the clock pin, the bidirectional buffer, to internal control logic, and to read-voltage and modify-voltage generators. A first switch is coupled to the read-voltage generator and the clock buffer and a second switch is coupled to the modify-voltage generator and the clock buffer, the first and second switches each having a control input. Memory drivers are coupled to the read-voltage generator and the modify-voltage generator through the first and second switches. First and second registers coupled between the serial interface logic and the first and second switches. A memory array is coupled to the memory drivers and read amplifiers and program buffers are coupled between the serial interface logic and the memory drivers. This architecture can be used to provide an external voltage for testing on the clock pin while a control signal is applied to the other I/O pin.

BRIEF DESCRIPTION OF THE DRAWING FIGURES

FIGS. 9A and 9B are external voltage management flow diagrams for external testing equipment and for the internal logic or micro-controller, respectively according to an embodiment of the present invention.

FIGS. 12A and 12B are external voltage management flow diagrams for external testing equipment and for internal logic or micro-controller, respectively, with preliminary phase obtained by a fixed delay time.

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

The present invention allows the employment of an external voltage source for testing of serial interface memories and for testing of parallel interface memories with a minimum number of pins available for testing. According to the present invention, one of the available pins is used to input an external voltage level for testing purposes and another pin is used to provide a synchronization signal.

The following description of an exemplary embodiment of the present invention will refer as an illustrative example to a flash memory with a serial interface having only two pins: an input pin (CLK) normally used to input an external clock and an input/output pin (DA) normally used to input addresses, data and commands to the memory and to retrieve data and information from the device. Persons of ordinary skill in the art will appreciate that the present invention is not limited to this specific case and can be implemented in a variety of memory devices with serial or parallel interfaces, and with a number of pins greater than two.

Figure 6:
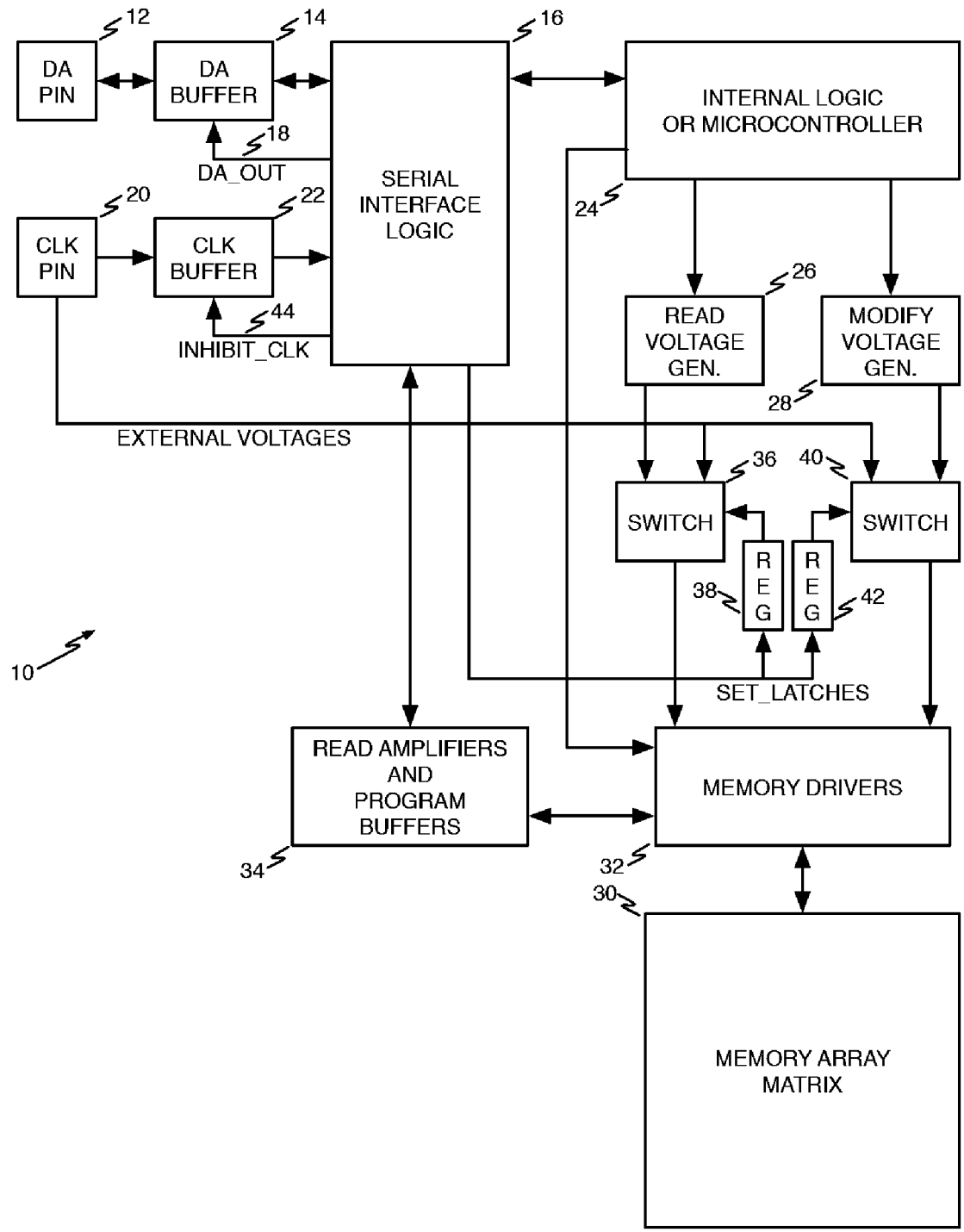
FIG. 6 is a block diagram of a flash memory with a serial interface according with the preferred embodiment of the present invention.

Referring now to FIG. 6, a block diagram illustrates a serial-interface flash memory device 10 according to an illustrative embodiment of the present invention. The DA pin 12 sends and collects data to and from DA bidirectional buffer 14. The direction of the DA buffer (input or output) is controlled by a serial interface logic 16 by means of signal DA_OUT on line 18, i.e. DA_OUT=0 enables the DA buffer as an input buffer to receive data input at the DA pin, and DA_OUT=1 enables the DA buffer as an output buffer to place output data on the DA pin. The CLK pin 20 is an input pin and the CLK buffer 22 is a single-direction input buffer. Serial interface logic 16 is connected to the internal logic or microcontroller 24 via handshake protocol or handshake logic as is known in the art. The internal logic or internal microcontroller 24 drives a read-voltage generator 26 and a modify-voltage generator 28 to supply, respectively, read voltage levels and program or erase voltage levels to the memory matrix array 30 via memory drivers 32 depending on the operation to be performed. Read amplifiers and program buffers 34 manage data flow between the memory drivers 32 and the serial interface logic 16.

According to the present invention, a switch 36 is interposed between read-voltage generator 26 and memory drivers 32. Switch 36 is controlled by the contents of test latch 38. Similarly, switch 40 is interposed between modify-voltage generator 28 and memory drivers 32. Switch 40 is controlled by the contents of test latch 42.

Figure 1:
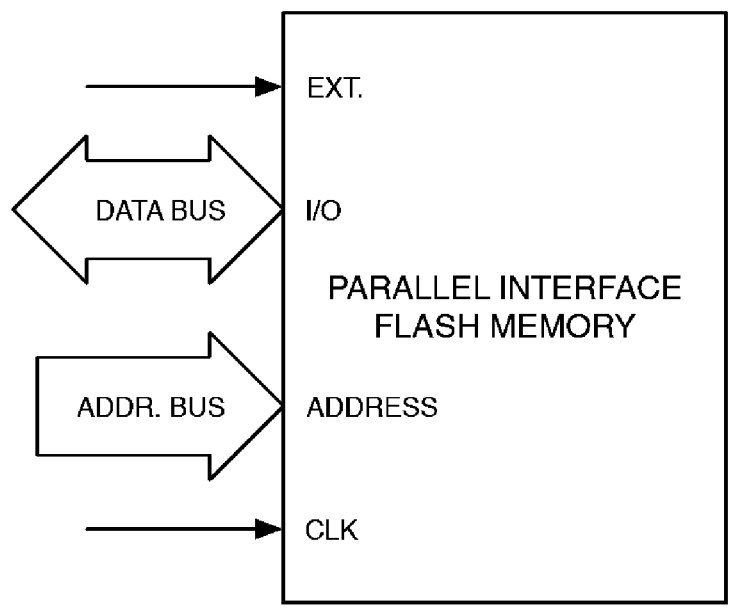
FIG. 1 is a pin diagram of a typical parallel interface flash memory (power supply pins not shown in figure).
Figure 2:
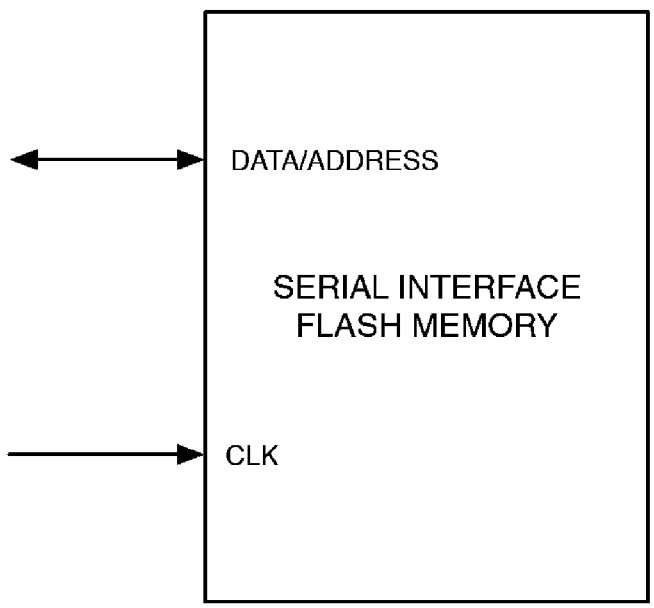
FIG. 2 is a pin diagram of a typical serial interface flash memory (power supply pins not shown in figure).
Figure 3:
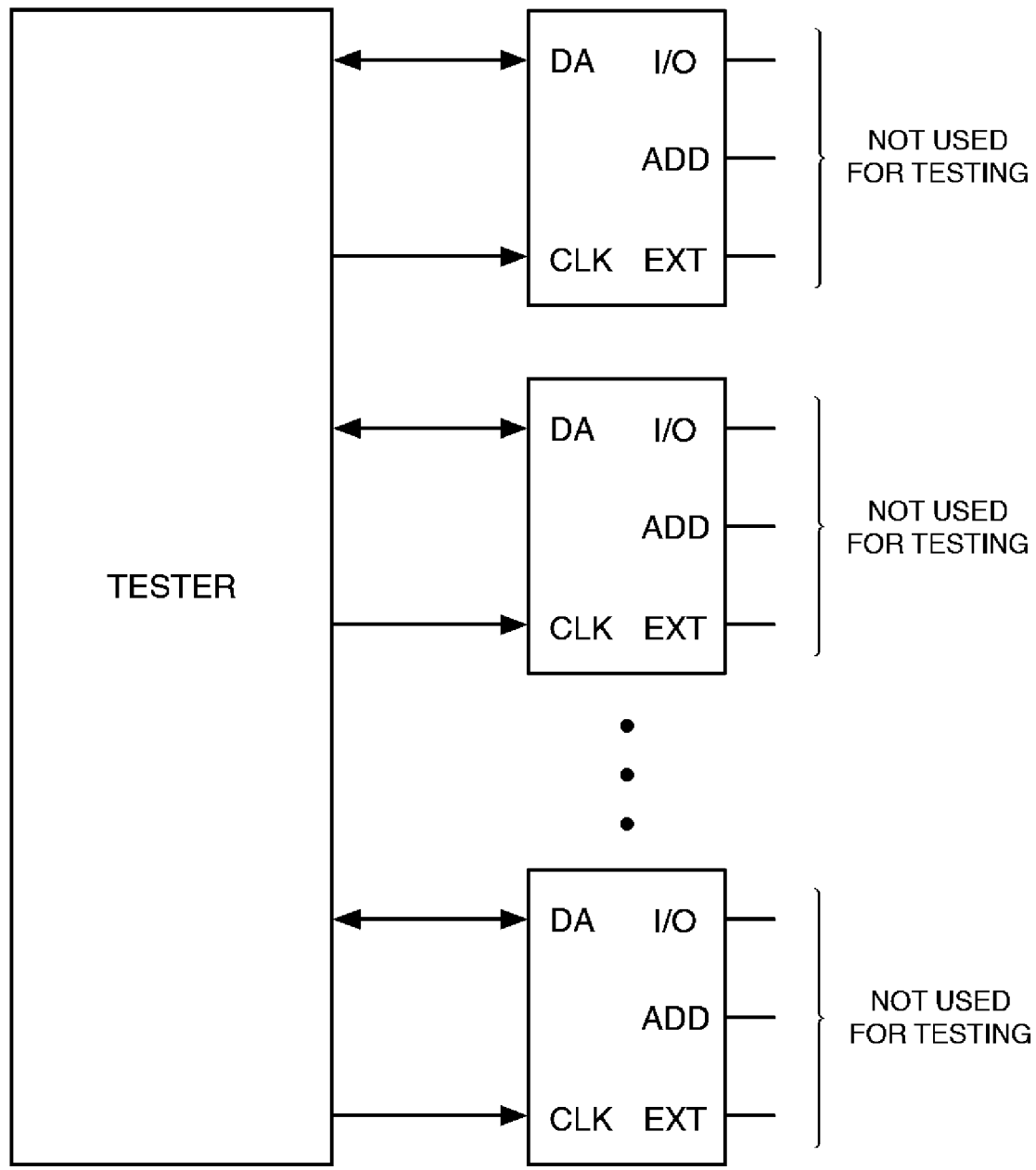
FIG. 3 is a block diagram of a typical configuration for performing simultaneous testing of multiple parallel interface flash memories (power supply pins not shown in figure).
Figure 4:
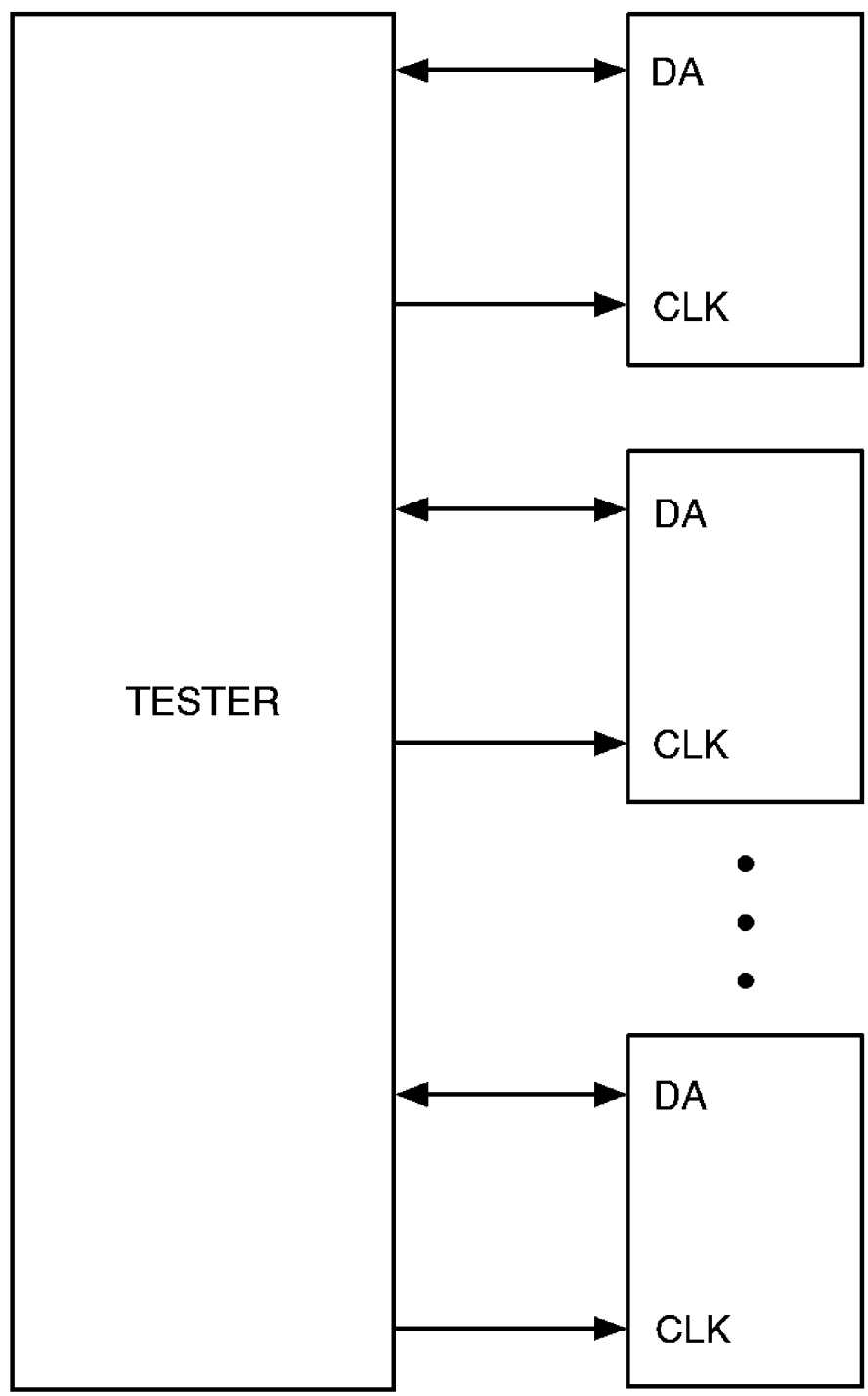
FIG. 4 is a block diagram of typical configuration for performing simultaneous testing of multiple serial interface flash memories (power supply pins not shown in figure).
Figure 5:
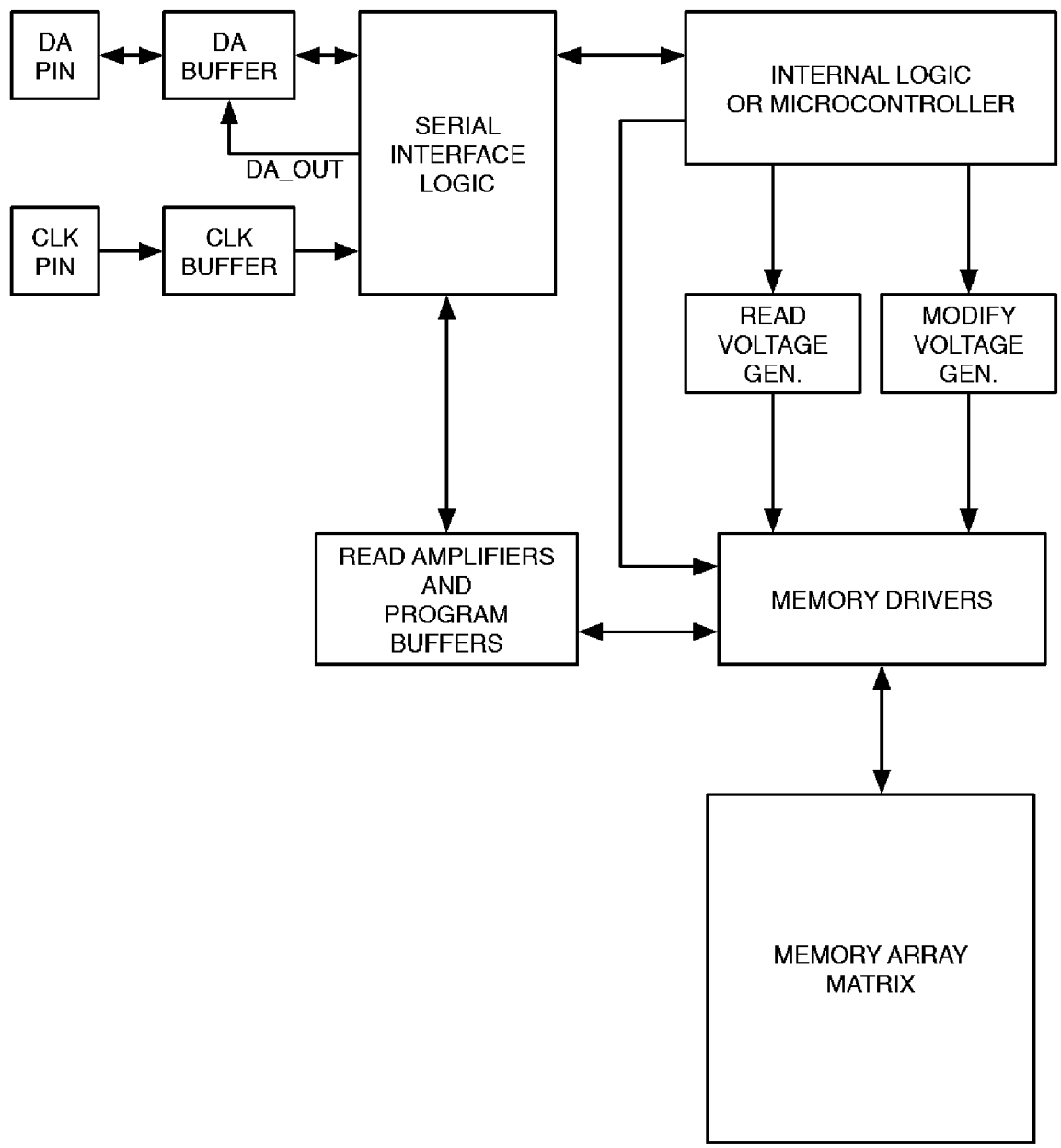
FIG. 5 is a block diagram of a prior-art flash memory with a serial interface.

In the serial-interface flash memory device 10 of FIG. 6, the CLK pin 20 has functionality in addition to that shown in the circuit of FIG. 5 in that it is used to provide the external voltages. The DA pin 12 can be used for synchronization. Of course the normal functionality of the two terminals, i.e. as a clock terminal and as a data/address input/output terminal are not affected.

External voltages provided on CLK pin 20 are provided to switches 36 and 40. Depending on the contents of test latches 38 and 42, the switches 36 and 40 pass to memory drivers 32 either internally generated voltages or the external voltages applied to clock pin 20. Test latches 38 and 42 are set by serial interface logic 16 depending on the test command issued during a test input phase, as will be disclosed herein.

Serial interface logic 16 decodes a command sequence entered during an input phase and issues a SET_LATCHES signal to test-latches 38 and 42 to couple the external voltage to memory drivers 32 through switches 36 and 40 if an external voltage is to be used. If testing is to be performed using internally-generated voltages, test latches 38 and 42 are not set and switches 36 and 40 deliver internal voltages to the memory drivers. Serial interface logic 16 can disable the clock signal from CLK buffer 22 using the signal INHIBIT_CLK on line 44 shown in FIG. 6.

Figure 7:
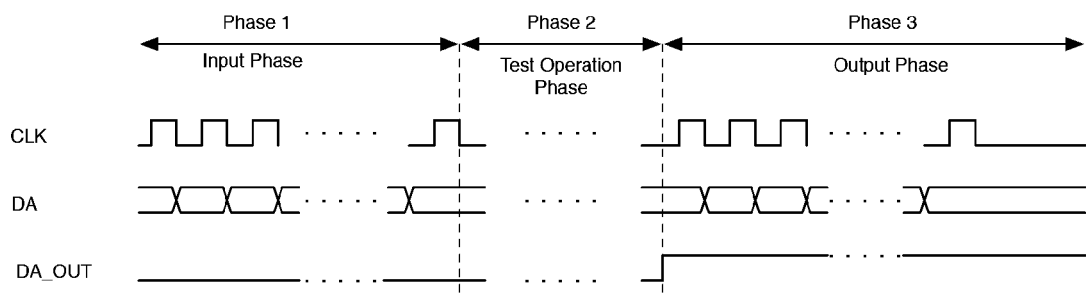
FIG. 7 is a typical timing diagram for a generic prior-art testing task.
Figure 8:
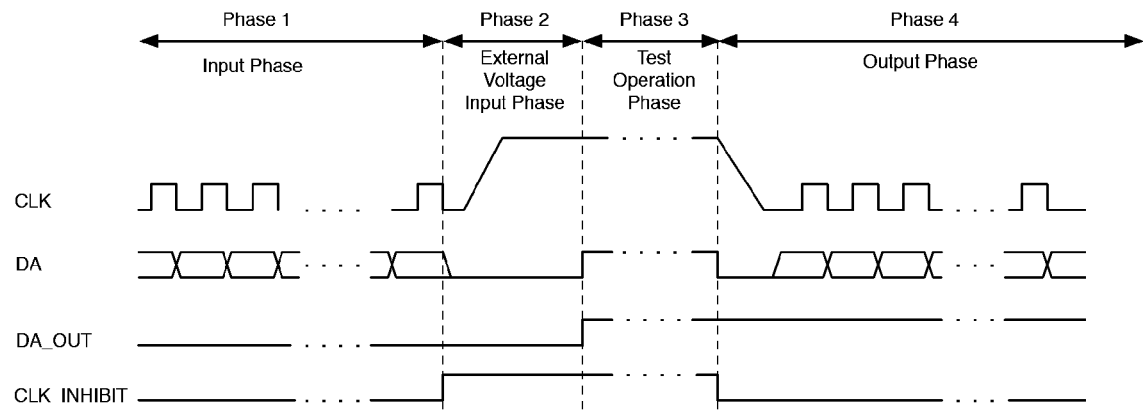
FIG. 8 is a timing diagram according to an embodiment of the present invention.

The management of the external voltage and synchronization signal may be understood with reference to FIGS. 7 and 8. Referring now to FIG. 7, consider a generic testing task using internally-generated voltages that includes a first phase (Phase 1) that inputs to the memory device 10 a test code or command specific to the operation to be performed; in this phase DA_OUT=0 and DA buffer 14 of FIG. 6 functions as an input buffer.

Then, after a given delay time necessary to perform the test (Phase 2 in FIG. 7), a subsequent phase produces an output result (Phase 3 in FIG. 7). In Phase 3 DA_OUT=1 and DA buffer operates as an output buffer.

Referring now to FIG. 8, assume that the test operation requires providing an external voltage level to memory device 10. As in FIG. 7, a first phase (Phase 1 in FIG. 8) is used to input a test code for the testing operations to be recognized from the device. In this first phase CLK pin 12 serves to provide clock signal and DA pin 20 serves to provide address/data/command input signals. During this phase DA_OUT=0 and INHIBIT_CLK=0, i.e. DA buffer 14 functions as an input buffer and the clock is enabled. Based on the test code provided to memory device 10 during Phase 1, the internal logic or microcontroller 24 realizes that an external voltage is to be applied. Therefore the test operation is not initiated at this point, as it would be in prior-art testing.

As shown in FIG. 8, following Phase 1, a second phase (Phase 2 in FIG. 8) includes applying the external voltage level on the CLK pin 20. This operation requires a time that is not known a priori, since it depends on how fast the testing equipment can provide the required voltage level on CLK pin 20.

As will be appreciated by persons of ordinary skill in the art, the externally applied voltage value may vary from test to test. Synchronization between an external testing machine and internal logic or microcontroller 24 can be obtained by using DA pin 12. When the external voltage source has ramped to the target value, a logical "1" is input on DA pin 12 and the testing operation is started. In this phase DA_OUT line 18 is still low enabling DA buffer 14 as an input buffer; INHIBIT_CLK=1 thus disabling the clock for serial logic interface.

In Phase 3 of FIG. 8, the device performs the required testing operation using the external voltage applied on CK terminal. The internal logic or micro-controller takes control of DA pin and issues a logical "1" until the operation is ended and DA pin is switched to a logical "0". In this phase DA_OUT=1, i.e. DA buffer works as an output buffer and INHIBIT_CK=1.

At this point test equipment realizes that test operation is ended by sensing a low level on DA pin 12 and can decrease the external voltage level (Phase 4 in FIG. 8). Phase 4 includes retrieval of test results as in prior-art testing. In this last phase the CLK pin 20 is used to provide a clock signal (INHIBIT_CLK=0) and DA pin 12 is used for data output (DA_OUT=1).

Referring now to FIGS. 9A and 9B, two flow diagrams illustrate an operational sequence for external voltage management according to the present invention. FIG. 9A is for the operation of external testing equipment and FIG. 9B is for the operation of the internal logic or micro-controller 24.

In FIG. 9A, the process starts at reference numeral 50. At reference numeral 52, the input phase (Phase 1 of FIG. 8) is entered. Next, at reference numeral 54, the external testing equipment sets the DA pin to logical "0" and places the external voltage on the CLK pin. Next, at reference numeral 56, the external testing equipment sets the DA pin to logical "1." This indicates that the external voltage is present at the CLK pin of the memory device. This starts Phases 2 and 3 of FIG. 8.

Next, the process enters a loop where, at reference numeral 58, the DA pin is sensed and at reference numeral 60 it is determined whether the DA pin is at a logical "0." If not, the process returns to reference numeral 58. If so, the process exits the loop. This loop senses whether the testing operation has been completed, since, when the testing is completed, the memory device sets the DA pin to logic "0."

When the testing is completed, and the memory device has set the DA pin to logic "0," the process proceeds to reference numeral 62 where the external tester sets the CLK pin to the clock voltage level. Next, at reference numeral 64, the output phase (Phase 4 of FIG. 8) is entered and the data is read out of the memory device. The process then terminates at reference numeral 66.

Referring now to FIG. 9B, the process inside of memory device 10 starts at reference numeral 70. At reference numeral 72, the input phase is executed, during which data is loaded into memory device 10 using the DA and CLK pins 12 and 20 as is known in the art.

After completion of the input phase, the process enters a loop in which the state of the DA pin 12 is sensed at reference numeral 74 and tested at reference numeral 76 to see if it has been set to logical "1" state by reference numeral 56 in FIG. 9A. This loop determines whether the external tester is ready to supply the external voltage to CLK pin 20. If not, the loop is reentered; if so, the process exits the loop.

Next, at reference numeral 78, the microcontroller 24 causes the serial interface logic 16 to set the DA pin 12 to a logical "1" state and performs the specified test operation. After the testing operation has been completed, the microcontroller 24 causes the serial interface logic 16 to set the DA pin 12 to a logical "0" state at reference numeral 80 and the memory device enters the output phase (Phase 4 in FIG. 8). This change to a logical "0" after completion of the testing is sensed by the external tester in the loop defined by reference numerals 58 and 60. After completion of the output phase, the process ends at reference numeral 84.

In certain cases it is useful to include a preliminary synchronization phase after the input phase and before the external-voltage input phase. This synchronization phase could be used by internal logic or microcontroller 24 of memory device 10 to perform preliminary tasks that must be performed prior to applying the external voltage level to CLK pin 20. Examples of such tasks include switch communications, voltage initializations and others. This requirement can easily be met by the present invention by employing a variation of the processes illustrated in FIGS. 9A and 9B.

Figure 10:
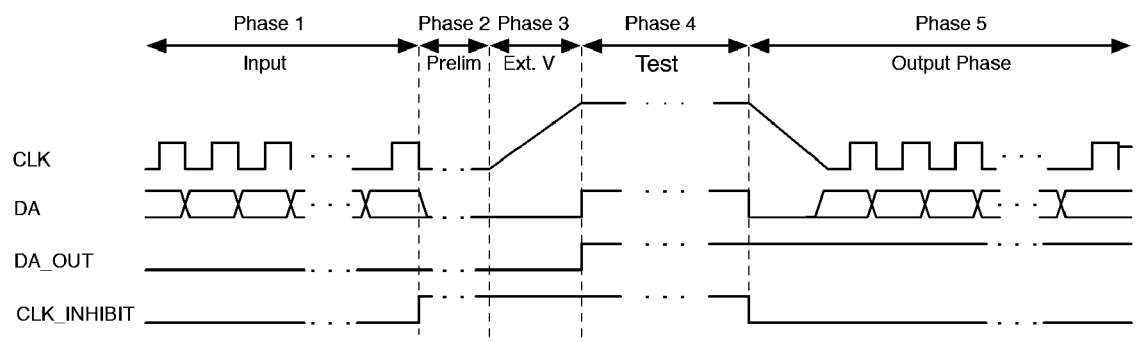
FIG. 10 is a timing diagram with a preliminary phase obtained with fixed delay time according to an embodiment of the present invention.

If the time duration of the preliminary phase is known, the testing equipment can simply wait for a proper time-delay period after input phase and prior to raising the external voltage on CLK pin 20. The timing of an illustrative such sequence is shown in FIG. 10.

Figure 11:
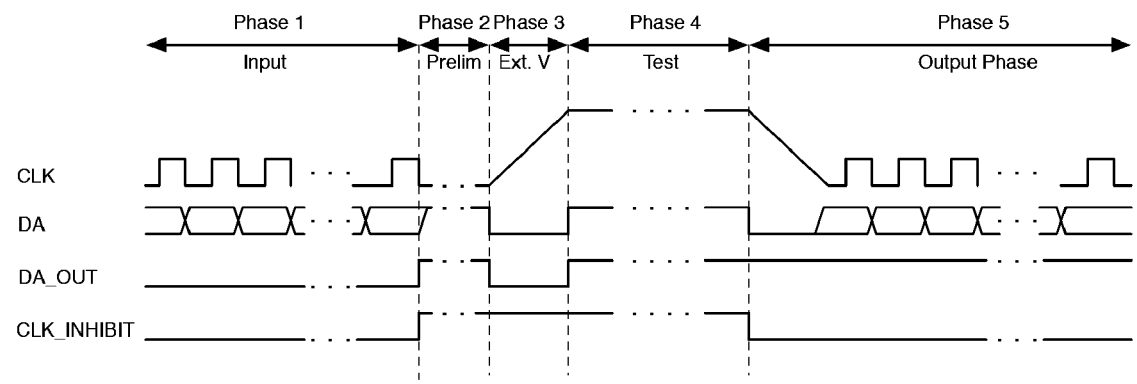
FIG. 11 is a timing diagram with a preliminary phase obtained with DA pin synchronization according to an embodiment of the present invention.

On the other hand, if the time required for the preliminary phase is not known a priori, synchronization can be accomplished using the DA pin 12. In fact, after input phase, the internal logic or microcontroller 24 can take control of DA pin 12 and can issue a logical "1" until the tasks performed during the preliminary phase is completed. During the preliminary phase DA_OUT=1, i.e. DA buffer 14 is configured to drive DA pin 12 and the INHIBIT_CLK=1, i.e. clock signal is disabled, is set by the serial interface logic 16. The timing of an illustrative such sequence is shown in FIG. 11.

An operational sequence for external voltage management according to this aspect of the present invention is shown in FIGS. 12A and 12B and FIGS. 13A and 13B, to which attention is now drawn. FIG. 12A is for the operation of external testing equipment and FIG. 12B is for the operation of the internal logic or micro-controller 24 in a circumstance where a fixed known time period is used for performing preliminary tasks.

In FIG. 12A, the process starts at reference numeral 90. At reference numeral 92, the input phase (Phase 1 of FIG. 10) is entered. Next, at reference numeral 94, the process waits for a fixed time period "T" (Phase 2 of FIG. 10). Next, at reference numeral 96, the external testing equipment sets the DA pin to logical "0" and places the external voltage on the CLK pin (Phase 3 of FIG. 10). Next, at reference numeral 98, the external testing equipment sets the DA pin to logical "1." This indicates that the external voltage is present at the CLK pin of the memory device. This starts Phases 4 and 5 of FIG. 10.

Next, the process enters a loop where, at reference numeral 100, the DA pin is sensed and at reference numeral 102 it is determined whether the DA pin is at a logical "0." If not, the process returns to reference numeral 100. If so, the process exits the loop. This loop senses whether the testing operation has been completed, since, when the testing is completed, the memory device sets the DA pin to logic "0."

When the testing is completed, and the memory device 10 has set the DA pin to logic "0," the process proceeds to reference numeral 104 where the external tester sets the CLK pin to the clock voltage level. Next, at reference numeral 106, the output phase (Phase 5 of FIG. 10) is entered and the data is read out of the memory device. The process then terminates at reference numeral 108.

Referring now to FIG. 12B, the process inside of memory device 10 starts at reference numeral 110. At reference numeral 112, the input phase is executed, during which data is loaded into memory device 10 using the DA and CLK pins 12 and 20 as is known in the art.

After completion of the input phase, at reference numeral 114 the device performs preliminary tasks within the time period "T." The process then enters a loop in which the state of the DA pin 12 is sensed at reference numeral 116 and tested to see if it has been set to logical "1" state by reference numeral 98 in FIG. 12A. This loop determines whether the external tester is ready to supply the external voltage to CLK pin 20. If not, the loop is reentered; if so, the process exits the loop.

Next, at reference numeral 120, the microcontroller 24 causes the serial interface logic 16 to set the DA pin 12 to a logical "1" state and performs the specified test operation (Phase 4 of FIG. 10). After the testing operation has been completed, the microcontroller 24 causes the serial interface logic 16 to set the DA pin 12 to a logical "0" state at reference numeral 122 and the memory device enters the output phase (Phase 5 in FIG. 10). This change to a logical "0" after completion of the testing is sensed by the external tester in the loop defined by reference numerals 100 and 102 in FIG. 12A. After completion of the output phase, the process ends at reference numeral 126.

Figure 13A:
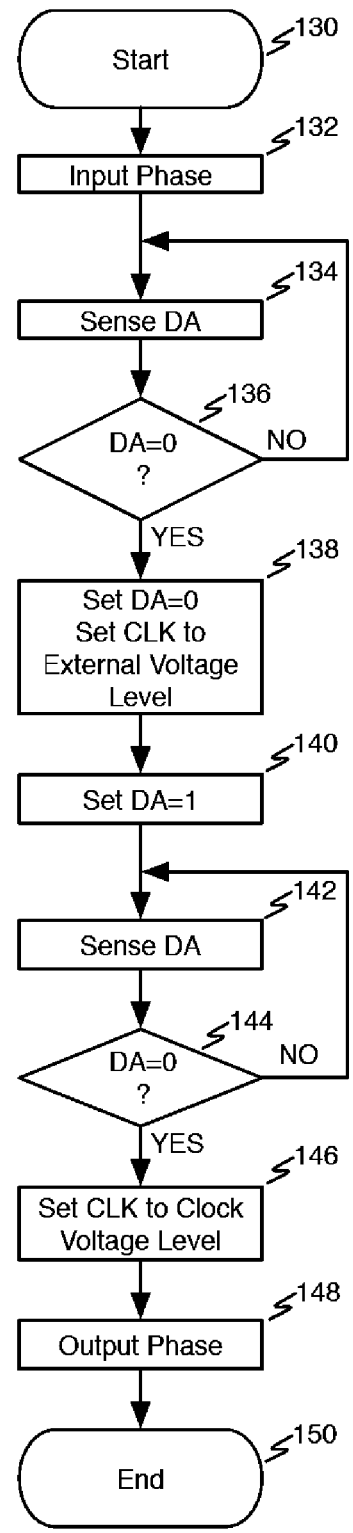
FIGS. 13A and 13B are external voltage management flow diagrams for external testing equipment and for internal logic or micro-controller, respectively, using DA pin synchronization.
Figure 13B:
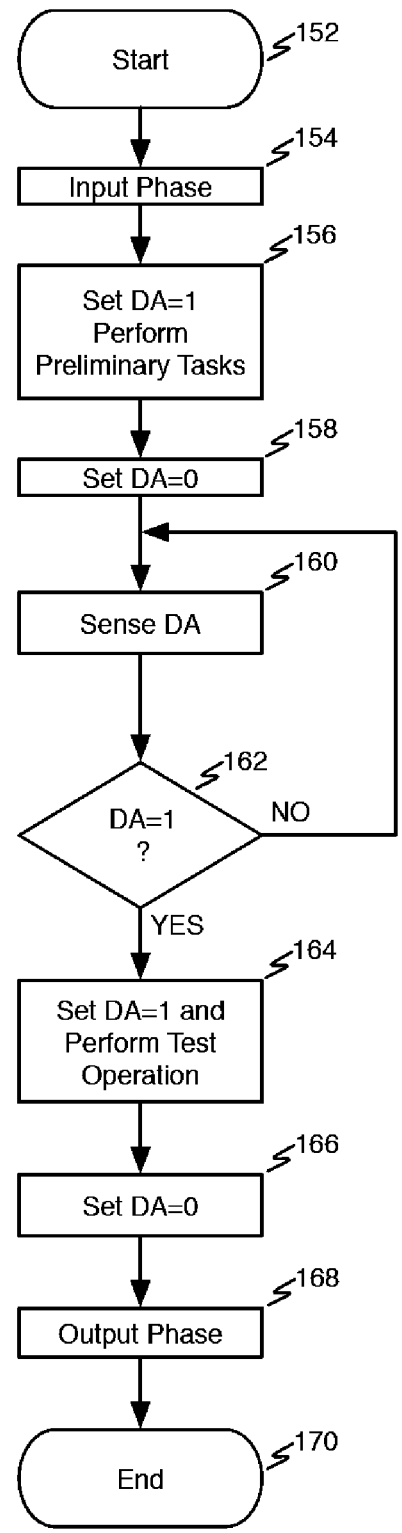

In situations where the preliminary phase is of unknown duration, the process of FIGS. 13A and 13B can be performed. In FIG. 13A, the process starts at reference numeral 130. At reference numeral 132, the input phase (Phase 1 of FIG. 11) is entered. The external tester then enters a loop defined by reference numerals 134 and 136 that sense the DA pin and determine if the DA pin is at a logical "0" to determine whether the memory device 10 has completed the tasks in the preliminary phase (Phase 2 of FIG. 11).

After the preliminary phase has ended and internal logic or microcontroller 24 issues a logical "0" on DA pin thus signaling to external equipment that preliminary phase is concluded, the CLK pin 20 is driven by the external tester to the desired external test voltage level at reference numeral 138. During this phase (Phase 3 of FIG. 11) DA pin 12 is kept at logical "0" by the external tester. When the external voltage is ready on the CLK pin, the external tester sets the DA pin to a logical "1." This will be sensed by the memory device to signal it to begin the testing.

Next, the process in the external tester enters a loop where, at reference numeral 142, the DA pin is sensed and at reference numeral 144 it is determined whether the DA pin is at a logical "0." If not, the process returns to reference numeral 142. If so, the process exits the loop. This loop senses whether the testing operation (Phase 4 of FIG. 11) has been completed, since, when the testing is completed, the memory device sets the DA pin to logic "0."

When the testing is completed, and the memory device 10 has set the DA pin to logic "0," the process proceeds to reference numeral 146 where the external tester sets the CLK pin voltage to the clock voltage level. Next, at reference numeral 148, the output phase (Phase 5 of FIG. 11) is entered and the data is read out of the memory device into the external tester. The process then terminates at reference numeral 150.

Referring now to FIG. 13B, the process inside of memory device 10 starts at reference numeral 152. At reference numeral 154, the input phase is executed, during which data is loaded from the external tester into memory device 10 using the DA and CLK pins 12 and 20 as is known in the art.

After completion of the input phase (Phase 1 of FIG. 11), at reference numeral 156, the memory device 10 performs the tasks in the preliminary phase (Phase 2 of FIG. 11). During this phase the internal logic or microcontroller 24 causes the serial interface logic to output a logical "1" on the DA pin 12. When these preliminary tasks are completed, the internal logic or microcontroller 24 causes the serial interface logic to output a logical "0" on the DA pin 12. This is sensed by the external tester, which responds by performing the tasks shown at reference numeral 138 of FIG. 13A. The process in memory device 10 then enters a loop in which the state of the DA pin 12 is sensed at reference numeral 160 and tested at reference numeral 162 to see if it has been set to logical "1" state by the process at reference numeral 140 in FIG. 13A. This loop determines whether the external tester is ready to supply the external voltage to CLK pin 20. If not, the loop is reentered; if so, the process exits the loop.

Next, at reference numeral 164, the microcontroller 24 causes the serial interface logic 16 to set the DA pin 12 to a logical "1" state and performs the specified test operation (Phase 4 of FIG. 11). After the testing operation has been completed, the internal logic or microcontroller 24 causes the serial interface logic 16 to set the DA pin 12 to a logical "0" state at reference numeral 166 and the memory device enters the output phase (Phase 5 in FIG. 11) as indicated at reference numeral 168. This change to a logical "0" after completion of the testing is sensed by the external tester in the loop defined by reference numerals 142 and 144 of FIG. 13A. After completion of the output phase, the process ends at reference numeral 170.

The present invention allows the use of external voltage for testing purposes on serial interface memories and on parallel interface memories to be tested with a limited number of pins. A first pin is used to input the external voltage level while the other pin is used to synchronize external test equipment with internal logic or micro-controller.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A serial-interface flash memory device including:
   a data/address I/O pin;
   a clock input pin;
   a bidirectional buffer coupled to the a data/address I/O pin;
   a clock buffer coupled to the clock input pin;
   internal control logic;
   a serial interface logic coupled to the clock buffer, the bidirectional buffer, and the internal control logic, the serial interface logic including a data-direction control coupled to the bidirectional buffer;
   a read-voltage generator coupled to the internal control logic;
   a modify-voltage generator coupled to the internal control logic;
   a first switch coupled to the read-voltage generator and the clock buffer, the first switch having a control input;
   a second switch coupled to the modify-voltage generator and the clock buffer, the second switch having a control input;
   memory drivers coupled to the read-voltage generator through the first switch and to the modify-voltage generator through the second switch;
   a first register coupled between the serial interface logic and the control input of the first switch;
   a second register coupled between the serial interface logic and the control input of the second switch;
   a memory array coupled to the memory drivers; and
   read amplifiers and program buffers coupled between the serial interface logic and the memory drivers.

2. The serial-interface flash memory device of claim 1 wherein the internal control logic comprises a microcontroller.

3. The serial-interface flash memory device of claim 1 wherein the serial interface logic is coupled to the internal logic using handshake protocol.

4. The serial-interface flash memory device of claim 1 wherein the serial interface logic is coupled to the internal logic using handshake logic.

5. A method for operating a memory device having a data pin and a clock pin including applying an external voltage from an external tester to the memory device to perform a test, comprising:
- clocking testing data into the memory device using the data pin and the clock pin;
- providing the external voltage from the tester on the DA clock pin and asserting a control signal on the DA pin;
- routing the external voltage to memory drivers in the memory device in response to the control signal;
- performing the test using the external voltage; and
- clocking test-result data out of the memory device into the external tester using the data pin and the clock pin.

6. The method of claim 5 further including:
- performing at least one preliminary task in the memory device after clocking testing data into the memory device and prior to routing the external voltage to memory drivers in the memory device in response to the control signal, the at least one preliminary task taking a fixed time period to accomplish; and
- pausing for a waiting period sufficient to perform at least one preliminary task before routing the external voltage to memory drivers in the memory device in response to the control signal, the at least one preliminary task taking a fixed time period to accomplish.

7. The method of claim 5 further including:
- performing at least one preliminary task in the memory device after clocking testing data into the memory device and prior to routing the external voltage to memory drivers in the memory device in response to the control signal, the at least one preliminary task taking a variable time period to accomplish; and
- pausing for a waiting period to perform at least one preliminary task before routing the external voltage to memory drivers in the memory device in response to the control signal; and
- sending a signal from the memory device to the external tester on the data pin to indicate that performance of the at least one preliminary task has been completed.

* * * * *

UNITED STATES PATENT AND TRADEMARK OFFICE
CERTIFICATE OF CORRECTION

| | | |
|---|---|---|
| PATENT NO. | : 7,525,856 B2 | Page 1 of 1 |
| APPLICATION NO. | : 11/696521 | |
| DATED | : April 28, 2009 | |
| INVENTOR(S) | : Surico et al. | |

It is certified that error appears in the above-identified patent and that said Letters Patent is hereby corrected as shown below:

In column 4, line 49, delete "phase" and insert -- phase, --, therefor.

In column 8, line 38, in Claim 1, delete "the a" and insert -- the --, therefor.

Signed and Sealed this

Twenty-first Day of July, 2009

JOHN DOLL
*Acting Director of the United States Patent and Trademark Office*